(12) United States Patent
Chen et al.

(10) Patent No.: US 7,046,036 B2
(45) Date of Patent: May 16, 2006

(54) OUTPUT BUFFER WITH LOW-VOLTAGE DEVICES TO DRIVER HIGH-VOLTAGE SIGNALS FOR PCI-X APPLICATIONS

(75) Inventors: Shih-Lun Chen, Hsinchu (TW); Ming-Dou Ker, Hsinchu (TW)

(73) Assignee: ADMtek Incorporated, Hsinchu (TW)

( * ) Notice: Subject to any disclaimer, the term of this patent is extended or adjusted under 35 U.S.C. 154(b) by 77 days.

(21) Appl. No.: 10/790,733

(22) Filed: Mar. 3, 2004

(65) Prior Publication Data

US 2005/0104622 A1    May 19, 2005

(30) Foreign Application Priority Data

Nov. 18, 2003    (TW) .............................. 92132205 A

(51) Int. Cl.
*H03K 19/02* (2006.01)

(52) U.S. Cl. ........................... 326/56; 326/57; 326/58; 326/68; 326/80

(58) Field of Classification Search ............ 326/56–58, 326/68, 80–81
See application file for complete search history.

(56) References Cited

U.S. PATENT DOCUMENTS 6,201,428 B1 * 3/2001 Clark .......................... 327/333
6,388,475 B1 * 5/2002 Clark et al. .................. 327/108

\* cited by examiner

*Primary Examiner*—Anh Q. Tran
(74) *Attorney, Agent, or Firm*—Troxell Law Office, PLLC

(57) ABSTRACT

An output buffer circuit with low-voltage devices to driver high-voltage signals for PCI-X applications is proposed. Because power supply voltage of PCI-X is at 3.3V, the high-voltage gate-oxide stress is a serious problem to design PCI-X I/O circuit in a 0.13 μm 1V/2.5V CMOS process with only low-voltage gate oxide. This proposed output buffer circuit can be operated at 133 MHz in 3.3V PCI-X environment without causing high-voltage gate-oxide reliability problem. In this design, the circuit is implemented in a 0.13 μm 1V/2.5V CMOS process and the output signal swing can be 3.3V. Besides, a level converter that converts 0V~1V voltage swing to 1V~3.3V voltage swing is also presented.

11 Claims, 10 Drawing Sheets

OUTPUT BUFFER WITH LOW-VOLTAGE DEVICES TO DRIVER HIGH-VOLTAGE SIGNALS FOR PCI-X APPLICATIONS

FIELD OF THE INVENTION

The present invention relates to an output buffer with low-voltage devices, and more particularly, to an output buffer with low-voltage devices to driver high-voltage signals for peripheral component interconnect extended (PCI-X) applications, capable of operating at 133 MHz in 3.3V PCI-X environment without causing high-voltage gate-oxide reliability problem. In addition, the present invention is implemented in a 0.13 μm 1V/2.5V CMOS process and the output signal swing can be 3.3V. Besides, a level converter that converts 0V~1V voltage swing to 1V~3.3V voltage swing is also presented.

BACKGROUND OF THE INVENTION

As the development of the semiconductor process, the thickness of gate-oxide is becoming thinner such that the electronic device is more adapted to the high frequency and high speed environment. The same time that the core power supply voltage (VDD) is also decreasing, however, the board voltage (VCC) is still remaining at between 3.3V to 5V, such as PCI-X interface. Hence, the high-voltage stress across the gate oxide becomes a serious problem in deep submicron (DSM) processes. To avoid using a high-cost tailor-make integrated circuit (IC) to solve the aforementioned problem, a circuit capable of receiving a high-voltage input signal, but being consisted by only using low-voltage devices with thin gate oxide is required such that the cost thereof can be decreased, and the IC volume is reduced for improving the easiness of designing PCB layout.

Recently, the number of transistors per IC grows due to higher computing demand, shrinking linewidth, and growth of die size. Even if die size were a constant, the number of transistors per IC would grow so that the Metal-Oxide Semiconductor Field Effect Transistors (MOSFET) is heavily used in current IC design. In constant electrical field scaling, not only the dimensions of MOSFET are shrunk, but also the voltages of the MOSFET are scaled. Consequently, semiconductor chips with different power supply voltage may exist in a same computer system or sub-system. In this regard, the I/O interfaces arranged between the foregoing chips should be capable of preventing the high voltage overstress and illegal current leakage path. The output buffer of the present invention is the answer for the above problems.

Refer to FIG. 1, which is a circuitry of a conventional tri-state output buffer. The tri-state output buffer used a NAND gate and a NOR gate as input end elements where the three signal input ends are the following: the signal input end EN of the NAND gate, the signal input end ENB of the NOR gate, and the signal input end IN formed by connecting a leg of the NADN gate and a leg of the NOR gate. In addition, the output end of the NAND gate is connected to the p-channel metal oxide semiconductor (PMOS) P1 through a level converter, and the output end of the NOR gate is connected directly to a n-channel metal oxide semiconductor (NMOS) N1. Since both the VDDs of the P1 and N1 are 2.5V that compare to the VCC, which is 3.3V or 5V, the transistors are prone to burn out. Hence, a new buffer architecture capable of receiving a high-voltage that can avoid the need to use other expensive tailor-make transistors in the circuitry thereof is required.

Please refer to FIG. 2, which shows a conventional level converter. The level converter of FIG. 2 is consisted of six transistors, which are P1, P2, P3, N1, N2, and N3. Wherein, the transistors P1, P2, N1, and N2 are the I/O (high-voltage (VDDQ)) devices and the transistors P3 and N3 are the core (low-voltage (VDD)) devices. Assume that VDD is at 1V and VCC is at 3.3V. The voltage gap between VCC and VDD is so large that the level converter can not operate correctly. Besides, the devices will have high-voltage gate-oxide stress. Thus, a new level converter is also required and presented in the present invention.

SUMMARY OF THE INVENTION

The primary object of the invention is to provide to an output buffer with low-voltage devices to driver high-voltage signals for peripheral component interconnect extended (PCI-X) applications, capable of operating at 133 MHz in 3.3V PCI-X environment without causing high-voltage gate-oxide reliability problem. In addition, the present invention is implemented in a 0.13 μm 1V/2.5V CMOS process and the output signal swing can be 3.3V.

Another object of the present invention is to provide a level converter that is capable of converting 0V~1V voltage swing to 1V~3.3V voltage swing, and the level converter is arranged inside the output buffer of the present invention.

Yet, another object of the present invention is to provide an output end module being consisted of a plurality of MOSFETs so as to improve the output characteristic thereof and the waveform of the same.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

DESCRIPTION OF THE PREFERRED EMBODIMENT

The output buffer of the present invention is designed in a 0.13 μm 1V/2.5V CMOS process for operating at 133 MHz and 66 MHz in 3.3V PCI-X environment, that is capable of receiving the VCC of PCI-X at 3.3V.

Figure 1:
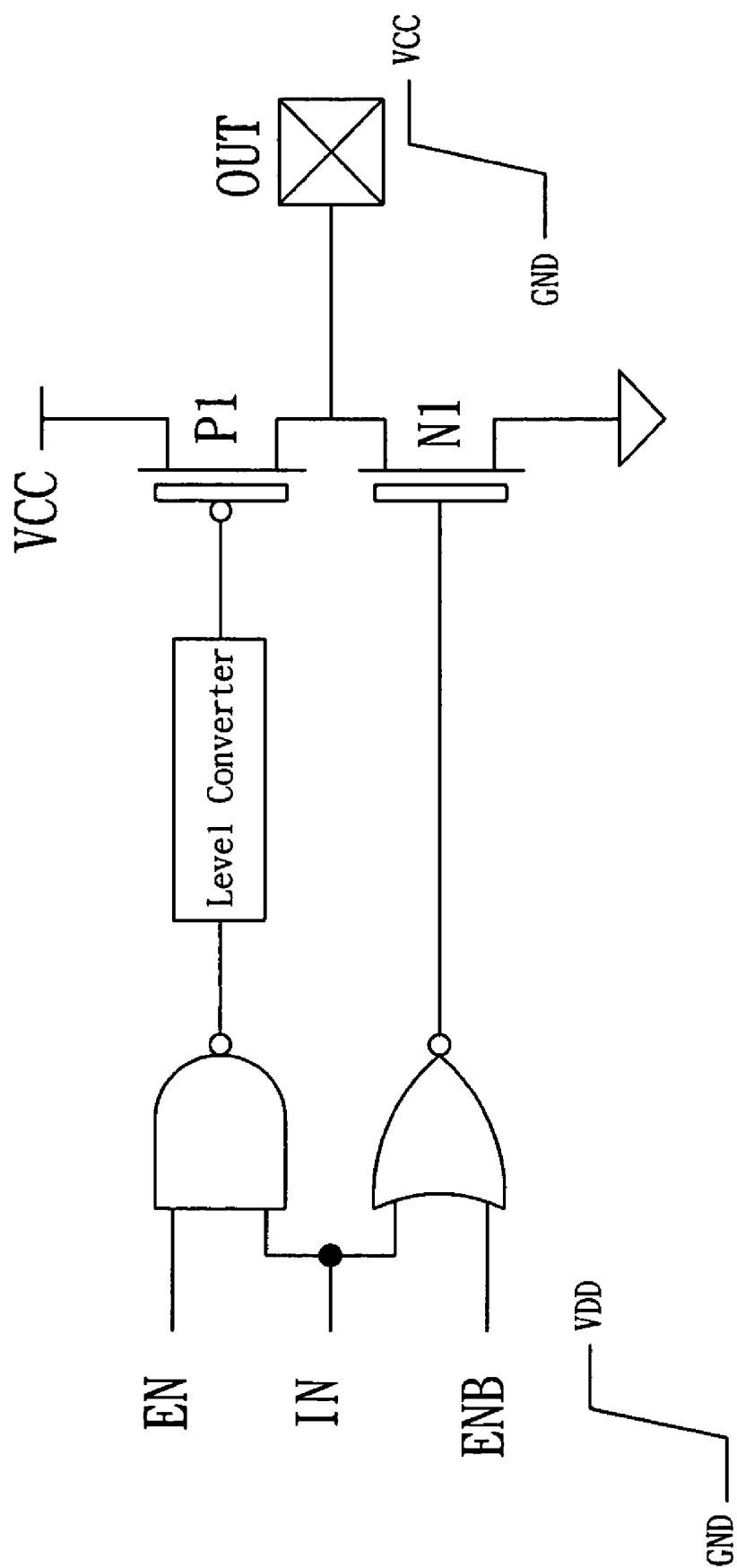
FIG. 1 is a circuitry of a conventional tri-state output buffer.
Figure 2:
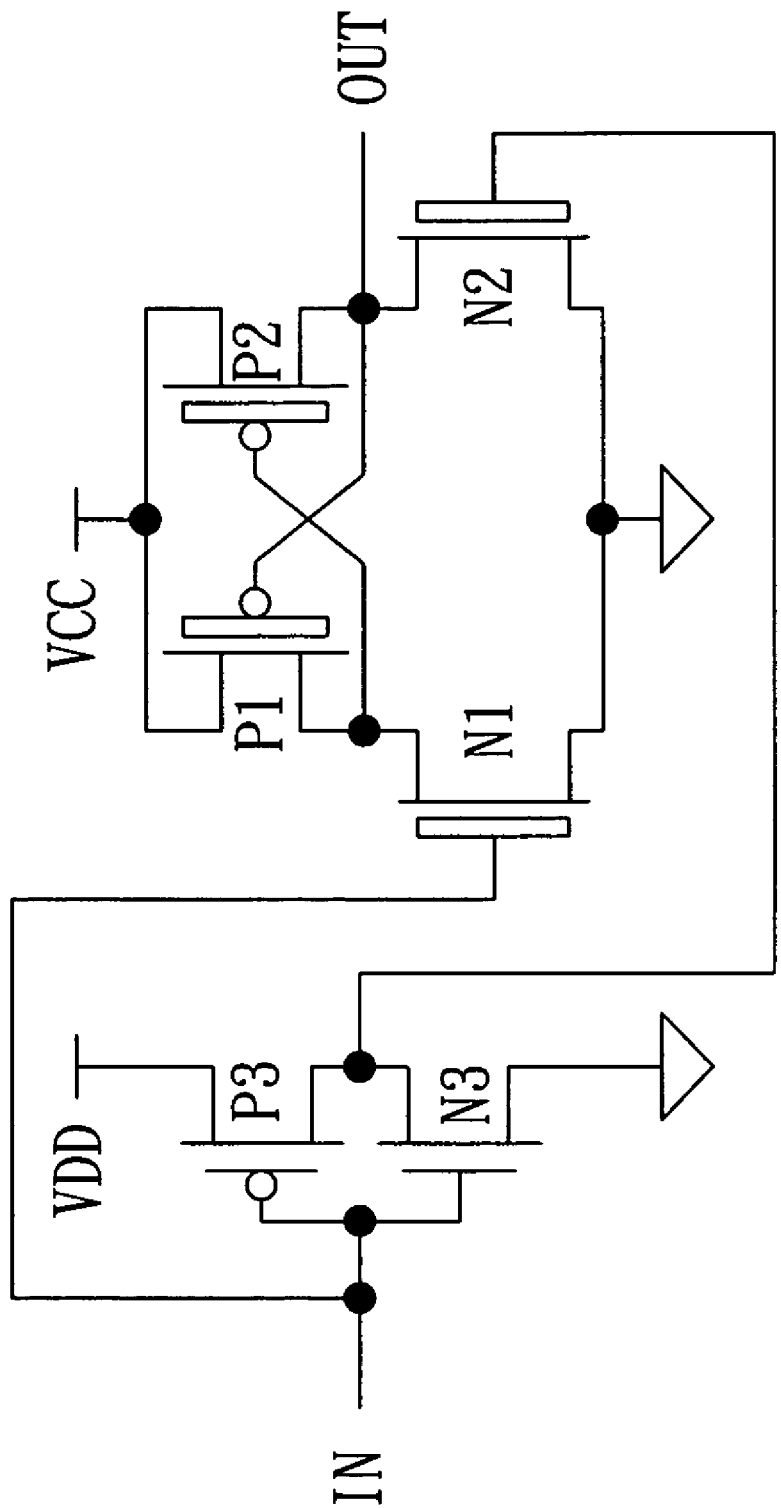
FIG. 2 is a circuitry of a conventional level converter.
Figure 3B:
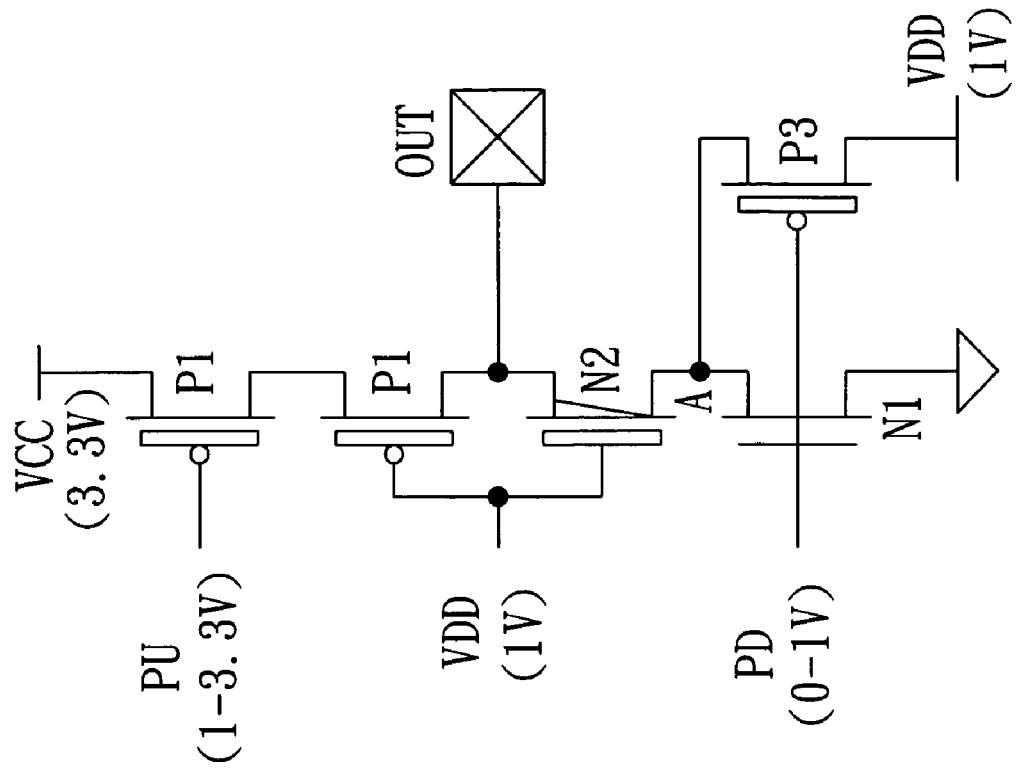
FIG. 3B is another preferred embodiment of an output end module according to the present invention.
Figure 3A:
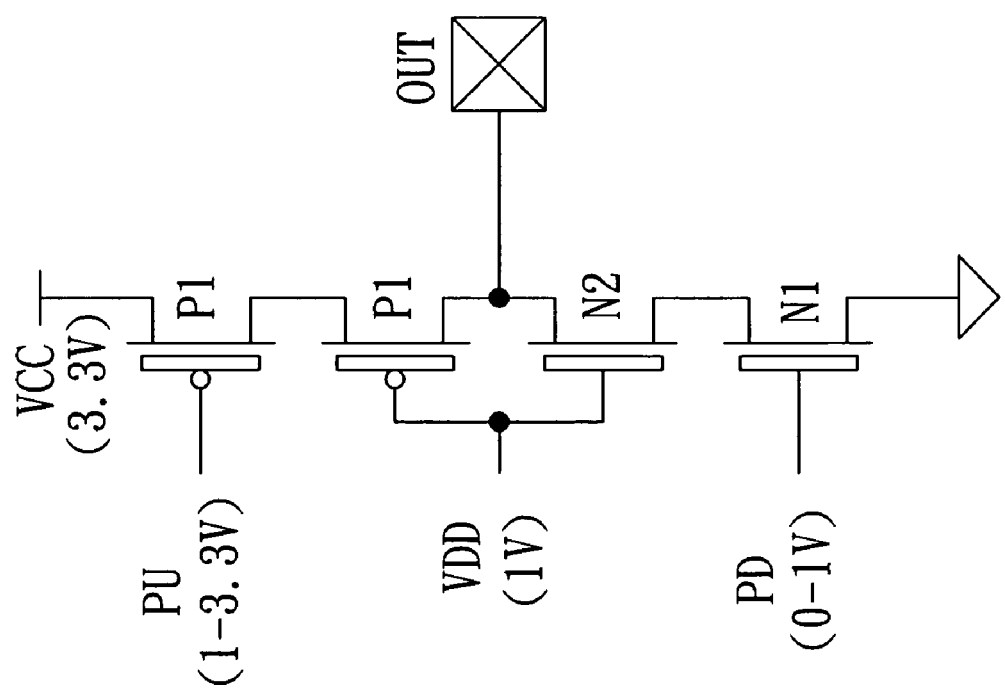
FIG. 3A is a preferred embodiment of an output end module according to the present invention.

Please refer to FIG. 3A, which is a preferred embodiment of an output end module according to the present invention. As seen in FIG. 3A, the pull-up path and pull-down path respectively has two stacked 2.5V PMOS transistors, i.e. P1, P2, and two stacked 2.5V NMOS transistors, i.e. N1, N2. The gate voltage of transistor P2 and that of transistor N2 are biased at VDD (1V) so that the extra bias generator can be omitted. Because the gate voltage of transistor P2 and that of transistor N2 are biased at 1V, the gate-source voltage (Vgs) and gate-drain voltage (Vgd) of transistor P2 and those of transistor N2 do not exceed 2.5V. The maximal Vgs and Vgd of transistor P2 and that of transistor N2 are about 2.3V. Transistor P2 and N2 protect transistor P1 and N1 to avoid the high-voltage gate-oxide stress. However, the source voltage of transistor P1 is at 3.3V. The minimum voltage swing of signal PU can't be lower than 0.8V (3.3V−2.5V=0.8V). Thus, the voltage swing of signal PU is designed between 1V (VDD) to 3.3V (VCC). A level converter that converts 0V~1V voltage swing to 1V~3.3V voltage swing is demanded.

Transistors N1 and N2 in FIG. 3A are normal Vt NMOS transistors. The threshold voltage (Vt) of 2.5V normal Vt NMOS transistor is still high as the Vgs is 1V. The driving capability of the pull-down path of FIG. 3A is too low. Therefore, a modified version of output stage is shown in FIG. 3B. Transistor N2 in FIG. 3B is a 2.5V native Vt NMOS transistor and transistor N1 in FIG. 3B is a 1V NMOS transistor. The native transistor Vt NMOS transistor is a standard device in a 0.13 μm 1V/2.5V CMOS process and no extra process is needed. Therefore, the driving capability in FIG. 3B is increased. Because the gate of transistor N2 is biased at 1V, the voltage of node A does not exceed in 1V. Thus, transistor N1 can operate without high-voltage gate-oxide stress. Because the transistor N2 is a native Vt NMOS transistor, the sub-threshold leakage problem is serious. As node A in FIG. 3B is at 3.3V, the sub-threshold current of transistor N2 may occur. Thus, node A may exceed 1V. An extra PMOS transistor P3 is added in FIG. 3B. As signals PU and PD are at logic "0" (1V and 0V), the node OUT is at VDD. Because signal PD is at 0V, transistor P3 turns on to keep node A at 1V. Thus, the high-voltage gate-oxide stress caused by sub-threshold leakage of transistor N2 is avoided. Because transistor P3 is a weak device that keeps node A at 1V, it can be a 2.5V nominal Vt PMOS transistor.

Figure 4:
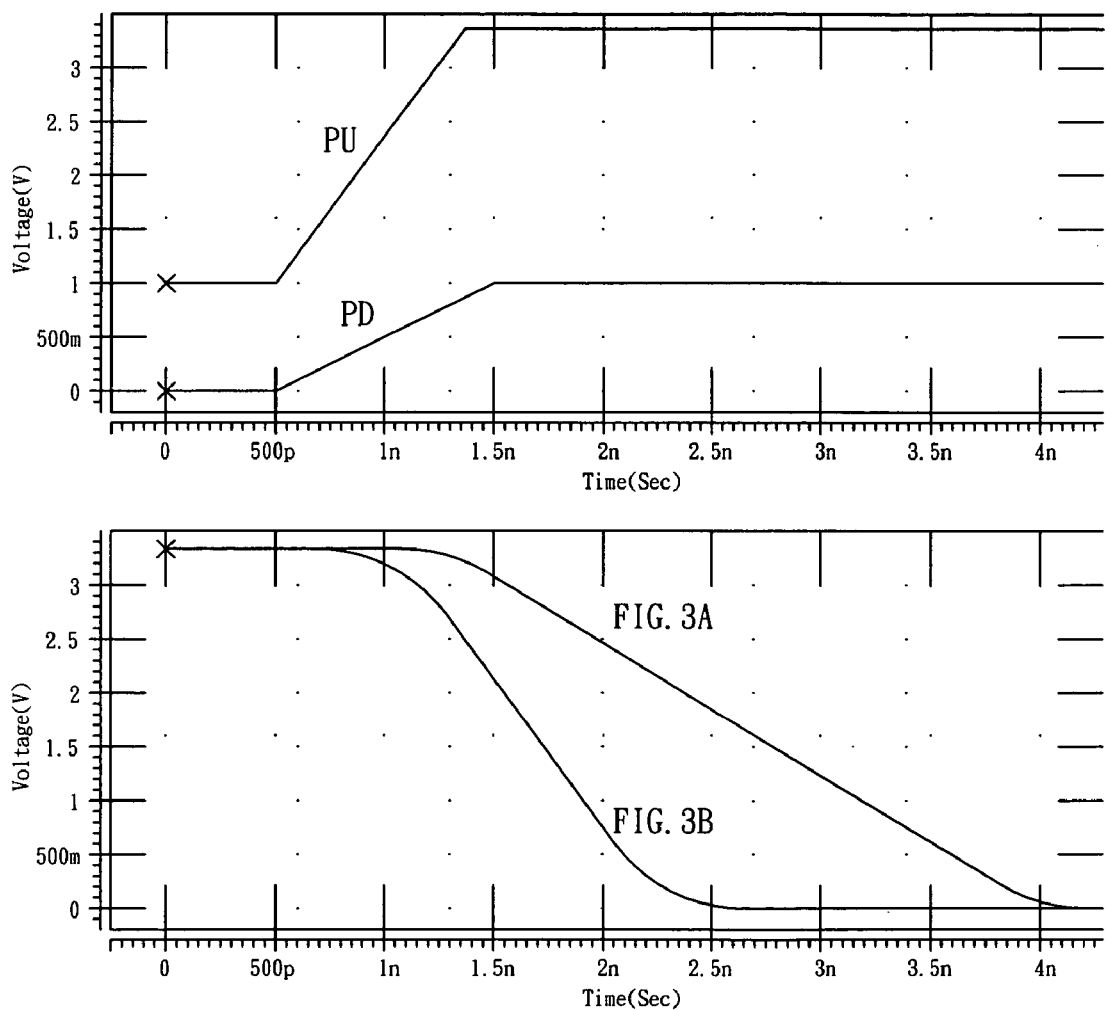
FIG. 4 shows the simulation waveform of FIG. 3A and FIG. 3B in respective.

FIG. 4 shows the simulation waveform of FIG. 3A and FIG. 3B in respective. In this simulation, the transistor size of this two output stage in FIGS. 3A and 3B is the same. As seen in FIG. 4 that the driving capability of FIG. 3B is better than that of FIG. 3A.

Figure 5:
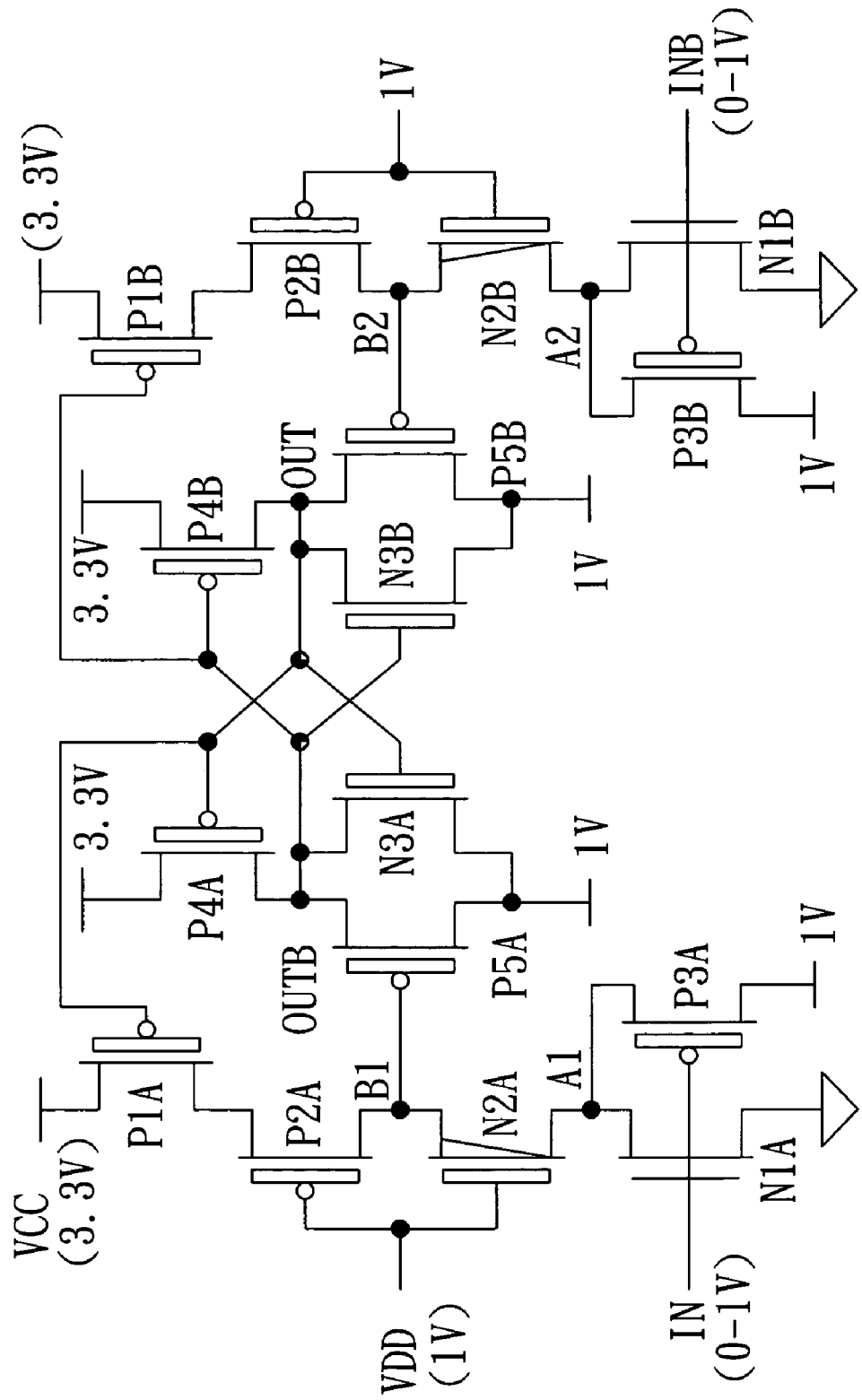
FIG. 5 is a circuitry of a preferred level converter according to the present invention.

FIG. 5 shows a circuitry of a preferred level converter according to the present invention that converts 0V~1V voltage swing to 1V~3.3V voltage swing. As seen in FIG. 4, transistor NIA and NIB are 1V NMOS transistors and transistors N2A and N2B are 2.5V native Vt NMOS transistors so that the driving capability is increased. The other transistors are 2.5V nominal Vt transistors. Transistors P3A and P3B keep node A1 and A2 at 1V as node B1 or B2 is at 3.3V. The swing of input signals IN and INB is 0V to 1V. As signal IN is at 1V and signal INB is at 0V, node B1 is pulled down to 0V and transistor P5A is turned on. As transistor P5A is turned on, node OUTB is pulled down to 1V and then transistors P4B and PIB are turned on. Thus, nodes OUT and B2 are pulled up to 3.3V.

As signal IN is at 0V and signal INB is at 1V, node B2 is pulled down to 0V and transistor P5B is turned on. As transistor P5B is turned on, node OUT is pulled down to 1V and then transistors P4A and P1A are turned on. Thus, node OUTB and B1 are pulled up to 3.3V. Because using PMOS transistors to pull down nodes OUT and OUTB is too slow, two cross-coupled NMOS transistors N3A and N3B are added to increase the pull-down speed.

Figure 6:
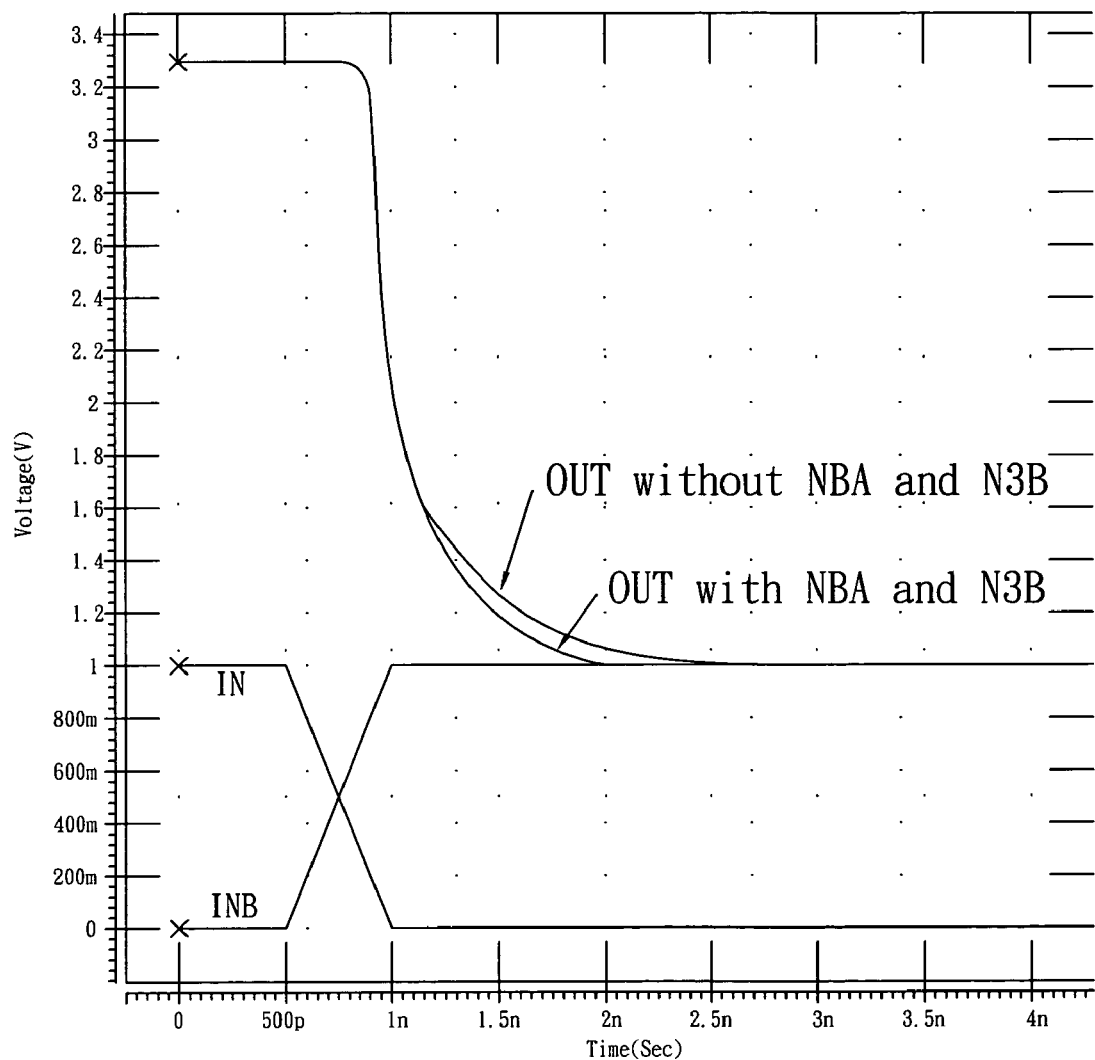
FIG. 6 shows the simulation waveform of the level converter seen in FIG. 5.

Please refer to FIG. 6, which shows the simulation waveform of the level converter seen in FIG. 5. As can be seen, the level converter with transistors N3A and N3B is faster than that without N3A and N3B.

Figure 7:
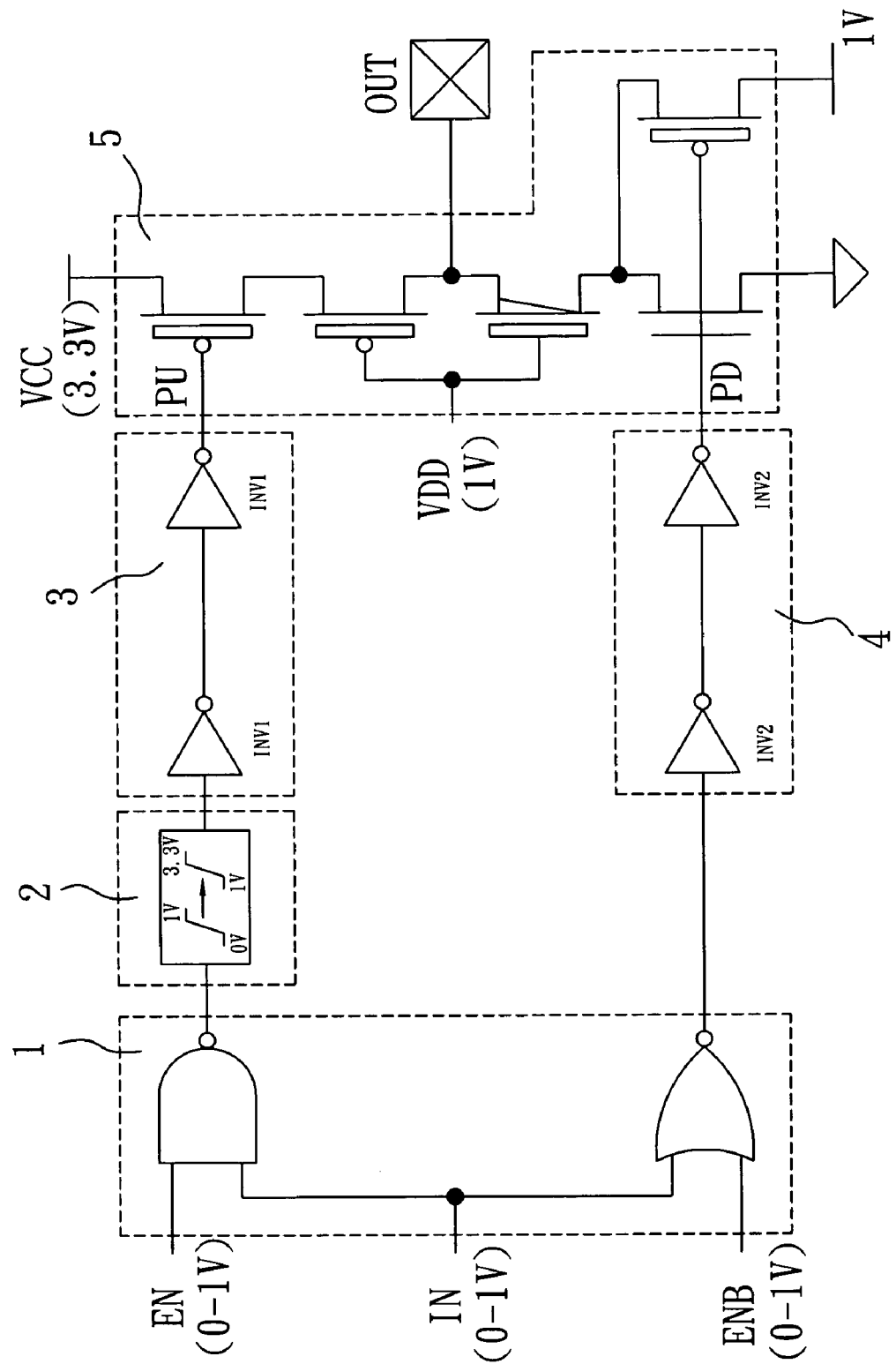
FIG. 7 is a circuitry of the output buffer of the present invention.
Figures 8A, 8B, 8C:
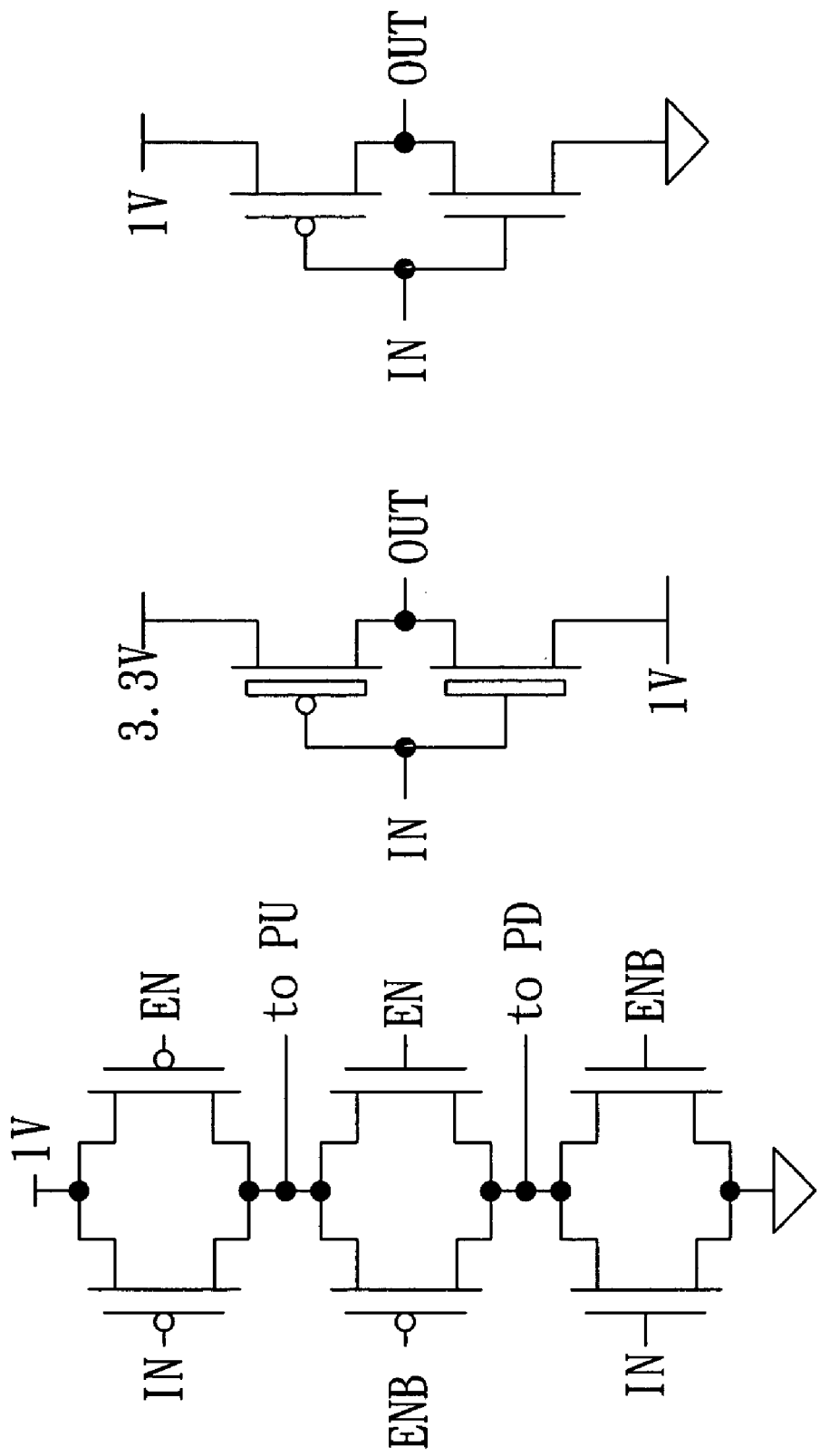
FIG. 8A is a circuitry of a preferred tri-state output control circuit according to the present invention.
FIG. 8B is a circuitry of a preferred first taper buffer according to the present invention.
FIG. 8C is a circuitry of a preferred second taper buffer according to the present invention.

Please refer to FIG. 7, which is a circuitry of the output buffer of the present invention. The output buffer of FIG. 7 consists of a tri-state control circuit 1, a level converter 2, a first taper buffer 3, a second taper buffer 4, and an output end module 5, wherein, the tri-state control circuit 1 further consists of a CMOS NAND gate and a CMOS NOR gate. As control signal EN is at 0V and control signal ENB is at 1V, the output buffer is at high-impendence state. As control signal EN is at 1V and control ENB is at 0V, the output buffer is enable. Another tri-state control circuit that consists of six transistors is shown in FIG. 8A. The tri-state control circuit 1 in FIG. 7 can be replaced as that in FIG. 8A. The output end module 5 of this output buffer is the same as that in FIG. 3B. The level converter that converts 0V~1V voltage swing to 1V~3.3V voltage swing is also shown in FIG. 5.

The first taper buffer 3 and the second taper buffer 4 are demanded to drive the output end module 5 because the transistors of the output end module 5 are large size devices. The first taper buffer 3 consists of INV1 that is shown in FIG. 8B, wherein the PMOS and NMOS transistors of the INV1 are 2.5V nominal Vt transistor transistors since the swing signal of PU is 1V~3.3V. The second taper buffer 4 consists of INV2 that is shown in FIG. 8C, wherein the PMOS and NMOS transistors of the INV2 are 1V nominal Vt transistors since the swing signal of PD is 0V~1V. In order to make the signal PU and PD in phase, the first taper buffer 3 has plural stages of INV1 and the second taper buffer has plural stages of INV2. For instance, in one embodiment of the present invention, the first taper buffer 3 has six stages of INV1 and the second taper buffer has eight stages of INV2. The output end module 5 is similar to that shown in FIG. 3A and FIG. 3B comprising at least a native Vt NMOS transistor and a 1V NMOS transistor.

Figure 9:
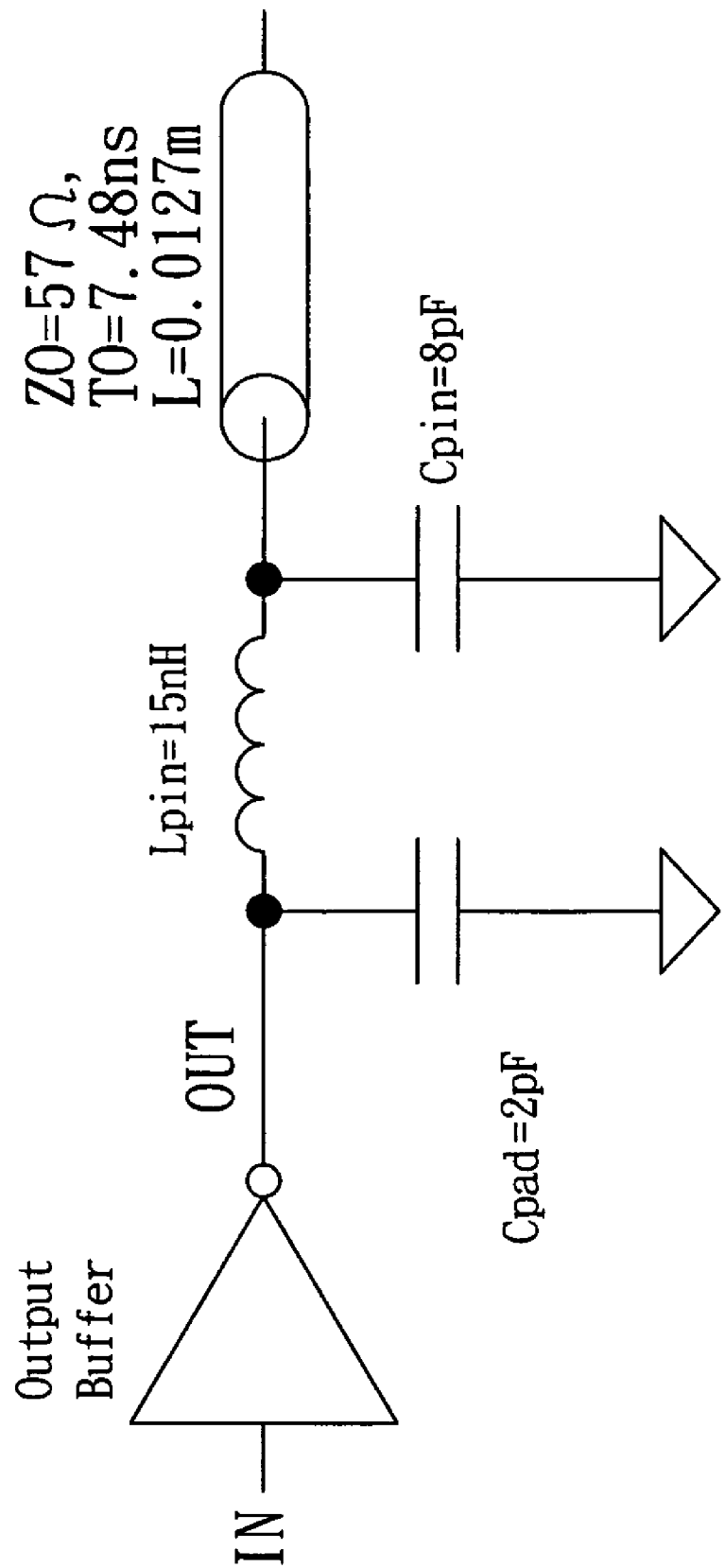
FIG. 9 shows a simulation environment of the present invention.

FIG. 9 shows the simulation environment of the present invention. Wherein, the capacitor Cpad includes the parasitic capacitance of the bonding pad and that of the ESD protection circuit, the inductance Lpin is the parasitic inductance of the package pin, and the capacitor Cpin is the parasitic capacitance of the package pin.

Figure 10:
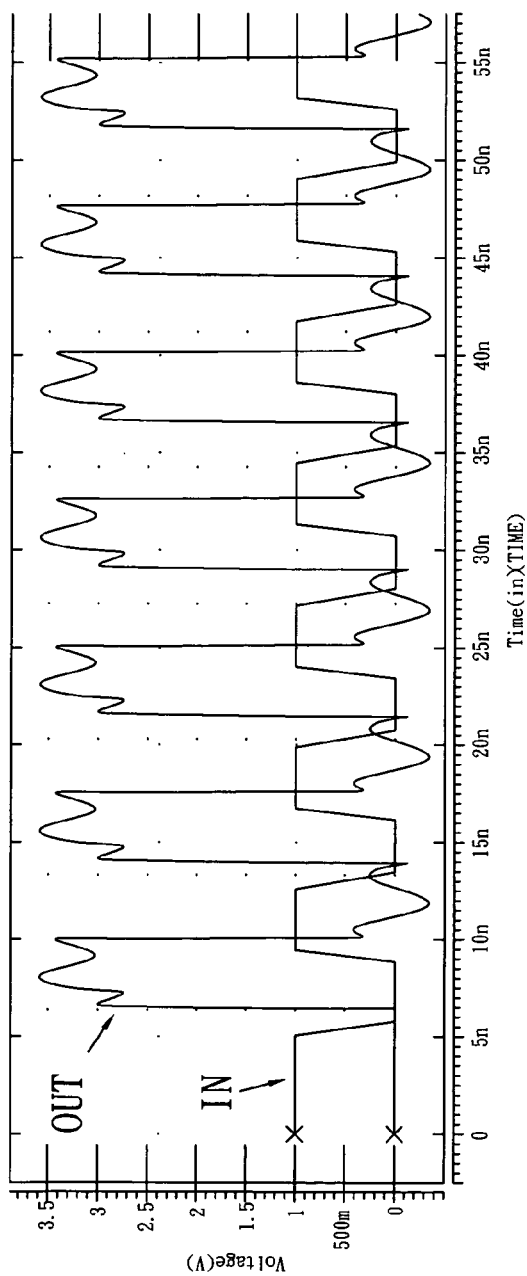
FIG. 10 shows the simulation waveform of a preferred output end module according to the present invention.
Figure 10:
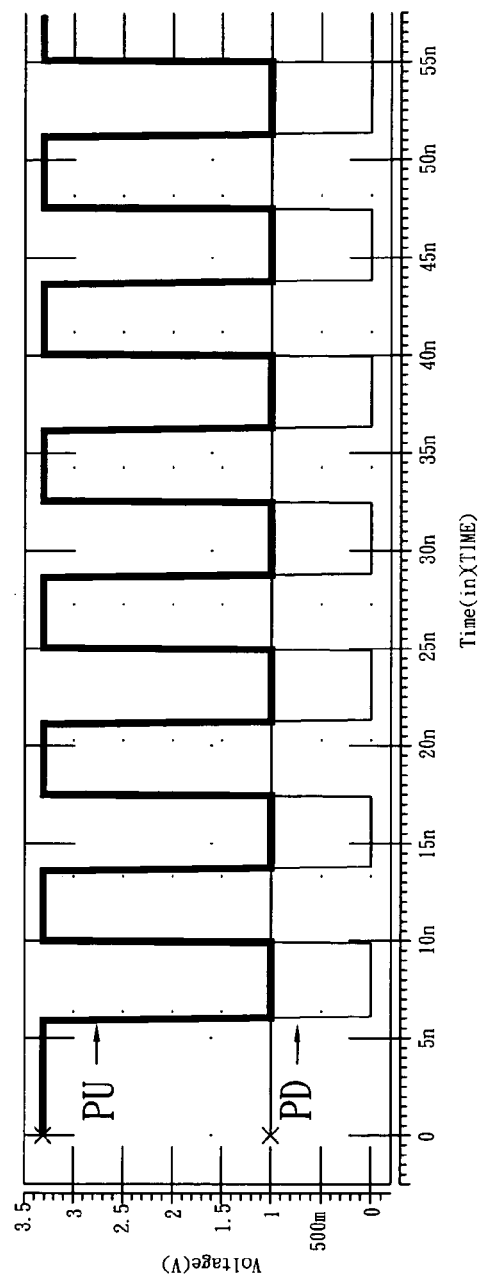

Please refer to FIG. 10, which shows the simulation waveform of a preferred output end module according to the present invention. It can be operated at 133 MHz and satisfied with the PCI-X specifications.

While the preferred embodiment of the invention has been set forth for the purpose of disclosure, modifications of the disclosed embodiment of the invention as well as other embodiments thereof may occur to those skilled in the art.

Accordingly, the appended claims are intended to cover all embodiments which do not depart from the spirit and scope of the invention.

Therefore, the aforementioned description is just several preferable embodiments according to the invention and, of course, can not limit the executive range of the invention, so any equivalent variation and modification made according to the claims claimed by the invention are all still belonged to the field covered by the patent of the present invention. Please your esteemed members of reviewing committee examine the present application in clear way and grant it as a formal patent as favorably as possible.

What is claimed is:

1. An output buffer with low-voltage devices to driver high-voltage signals, comprising:
    a tri-state control circuit, capable of receiving and processing external low-voltage signals and high-voltage signals and outputting at least two resulting signals;
    a level converter, connected to the tri-state control circuit by one end thereof, for receiving the resulting signals so as to convert low voltage swing to high-voltage swing;
    an output end module, consisting of a plurality of serial-connected metal-oxide semiconductor field effect transistors;
    a first taper buffer, having one end connecting to the level converter and another end thereof connecting to the output end module; and
    a second taper buffer, having one end connecting to the tri-state control circuit and another end thereof connecting to the output end module, wherein the plurality of serial-connected metal-oxide semiconductor field effect transistors include at least a native Vt NMOS transistor.

2. The output buffer with low-voltage devices of claim 1, wherein the maximum voltage receivable by the plurality of serial-connected metal-oxide semiconductor field effect transistors is 2.5V.

3. The output buffer with low-voltage devices of claim 1, wherein the output buffer is capable of driving high-voltage signals for PCI-X applications.

4. The output buffer with low-voltage devices of claim 3, wherein the output buffer is operating between 133 MHz and 66 MHz in PCI-X environment.

5. The output buffer with low-voltage devices of claim 1, wherein the output buffer is designed in a 0.13 μm 1V/2.5V CMOS process.

6. The output buffer with low-voltage devices of claim 1, wherein the tri-state output buffer consists of a CMOS NAND gate and a CMOS NOR gate.

7. The output buffer with low-voltage devices of claim 1, wherein PMOS and NMOS transistors of the first taper buffer are 2.5V nominal Vt transistors.

8. The output buffer with low-voltage devices of claim 1, wherein PMOS and NMOS transistors of the second taper buffer are IV nominal Vt transistors.

9. The output buffer with low-voltage devices of claim 1, wherein the plurality of serial-connected metal-oxide semiconductor field effect transistors include at least a 1V NMOS transistor.

10. The output buffer with low-voltage devices of claim 1, wherein a swing voltage of the first taper buffer is between 1V and 3.3V.

11. The output buffer with low-voltage devices of claim 1, wherein a swing voltage of the second taper buffer is between 0V and 1V.

* * * * *